(12) United States Patent
Pan et al.

(10) Patent No.: US 9,844,154 B1
(45) Date of Patent: Dec. 12, 2017

(54) ELECTRONIC DEVICE AND PACKAGING BOX THEREOF

(71) Applicant: BOTHHAND ENTERPRISE INC., Tainan (TW)

(72) Inventors: Yung-Ming Pan, Taoyuan (TW); Chung-Cheng Fan, Taoyuan (TW)

(73) Assignee: Bothhand Enterprise Inc., Tainan (TW)

( * ) Notice: Subject to any disclaimer, the term of this patent is extended or adjusted under 35 U.S.C. 154(b) by 0 days.

(21) Appl. No.: 15/378,986

(22) Filed: Dec. 14, 2016

(30) Foreign Application Priority Data

Sep. 5, 2016 (TW) .............................. 105128609 A

(51) Int. Cl.
| | | |
|---|---|---|
| *H05K 5/00* | (2006.01) | |
| *H01R 12/52* | (2011.01) | |
| *H01R 12/57* | (2011.01) | |
| *H05K 5/02* | (2006.01) | |

(52) U.S. Cl.
CPC ........... *H05K 5/0069* (2013.01); *H01R 12/52* (2013.01); *H01R 12/57* (2013.01); *H05K 5/0247* (2013.01)

(58) Field of Classification Search
CPC .... H05K 5/0069; H05K 5/0247; H01R 12/52; H01R 12/57

USPC ..... 361/679.01, 679.02, 728, 736, 748, 752, 361/760
See application file for complete search history.

(56) References Cited

U.S. PATENT DOCUMENTS

| | | | |
|---|---|---|---|
| 6,912,781 B2 * | 7/2005 | Morrison | H01F 27/292 29/592.1 |
| 2013/0208439 A1 * | 8/2013 | Aripin | H01L 23/3107 361/813 |
| 2015/0049421 A1 * | 2/2015 | Paek | H01L 24/82 361/676 |

* cited by examiner

*Primary Examiner* — Tremesha S Willis
(74) *Attorney, Agent, or Firm* — Michael Best & Friedrich LLP

(57) ABSTRACT

An electronic device includes a packaging box, multiple connecting pins, and an electronic unit mounted to a base of the packaging box and including multiple wires. The base includes a wire holding platform having multiple spaced-apart insertion through holes. The connecting pins are mounted to the wire holding platform, and each have a first wire connecting portion mounted in a corresponding insertion through hole, having a first through hole and a first electrically connecting portion connected between the first wire connecting portion and a circuit board. Each of the wires has two electrically conductive portions, each of which is connected to the first wire connecting portion of a corresponding connecting pin.

8 Claims, 8 Drawing Sheets

US 9,844,154 B1

ELECTRONIC DEVICE AND PACKAGING BOX THEREOF

CROSS-REFERENCE TO RELATED APPLICATION

This application claims priority of Taiwanese Patent Application No. 105128609, filed on Sep. 5, 2016.

FIELD

The disclosure relates to an electronic device, and more particular to an electronic device and a packaging box thereof.

BACKGROUND

Referring to FIGS. 1 and 2, a conventional electronic device includes a package box 1 and a plurality of electronic units 2 mounted in the package box 1. Each of the electronic units 2 includes a plurality of wires 21 each having a wire core 211 and an insulating layer 212 sleeved on the wire core 211.

The package box 1 includes a base 11 and a plurality of connecting pins 12 mounted to the base 11. The base 11 includes a base plate 111 and two holding platforms 113 that are respectively connected to opposite ends of the base plate 111. Each of the holding platforms 113 includes an upright wall 114, a horizontal wall 115 extending outwardly from an upper end of the upright wall 114, two extending walls 116 that respectively and upwardly extend from the upper end of the upright wall 114 and a distal end of the horizontal wall 115, and a plurality of separating walls 117 that are connected between the extending walls 116, that are spaced apart from each other, and that cooperate with the extending walls 116 to define a plurality of welding spaces 118. Each of the extending walls 116 has a plurality of wire holding grooves 119 that are respectively aligned with the welding spaces 118. Each of the connecting pins 12 is mounted to a corresponding one of the holding platforms 113, and has an electrically connecting portion 121 that extends downwardly from the corresponding holding platform 113, and a wire connecting portion 122 that is electrically connected to the electrically connecting portion 121 and that extends into a respective one of the welding spaces 118.

In the process of assembling the conventional electronic device, each of the wires 21 of each of the electronic units 2 is subjected to fire baking to remove a portion of the insulating layer 212 to expose a portion 213 of the wire core 211. Then, the electronic units 2 are placed on the base plate 111, followed by fixing the portion 213 of the wire core 211 of each of the wires 21 of the electronic units 2 into a corresponding pair of the holding grooves 119 of the extending walls 116. Afterwards, molten solder is dripped into the welding spaces 118 to electrically and respectively fixing the portions 213 of the wire cores 211 of the wires 21 of the electronic units 2 to the wire connecting portions 122 of the connecting pins 12.

Since the welding spaces 118 are rather small in dimension and the base 11 is usually made of plastic materials that may be molten due to the high temperature of fire baking, the abovementioned fire baking process must be conducted before assembling the electronic units 2 to the base 11, so as to avoid the influence of high temperature to the base 11. Such fire baking and assembling processes are time consuming. Moreover, care must be taken when fixing each of the portions 213 of the wire cores 211 to the corresponding pair of the holding grooves 119, so as to avoid misalignment of each of the portions 213 of the wire cores 211 from the respective one of the wire connecting portions 122.

SUMMARY

Therefore, an object of the present disclosure is to provide an electronic device and a package box thereof that can alleviate at least one of the drawbacks associated with the prior art.

According to a first aspect of the present disclosure, an electronic device is adapted to be electrically connected to a circuit board.

The electronic device includes a packaging box and an electronic unit. The packing box includes a base, and a connecting pin unit that includes a plurality of first connecting pins. The base includes at least one wire holding platform that includes a holding wall having a plurality of insertion through holes spaced apart from each other. The first connecting pins are mounted to the wire holding platform. Each of the first connecting pins has a first wire connecting portion that is mounted in a corresponding one of the insertion through holes of the wire holding platform and that has a first through hole formed therethrough, and a first electrically connecting portion that is adapted to be electrically connected between the first wire connecting portion of a corresponding one of the first connecting pins and the circuit board. The electronic unit is mounted to the base, and includes a plurality of wires. Each of the wires has two electrically conductive portions, each of which is electrically connected to the first wire connecting portion of a corresponding one of the first connecting pins According to a second aspect of the present disclosure, a packaging box is adapted to electrically interconnect an electronic unit and a circuit board. The electronic unit includes a plurality of wires, each of which has two electrically conductive portions.

The packaging box includes a base and a connecting pin unit. The base includes at least one wire holding platform that includes a holding wall having a plurality of insertion through holes spaced apart from each other. The base is adapted to be mounted with the electronic unit. The connecting pin unit includes a plurality of first connecting pins mounted to the wire holding platform. Each of the first connecting pins has a first wire connecting portion that is mounted in a corresponding one of the insertion through holes of the holding platform, that has a first through hole formed therethrough, and that is adapted to be electrically connected to a corresponding one of the electrically conductive portions of a corresponding one of the wires of the electronic unit, and a first electrically connecting portion that is adapted to be electrically connected between the first wire connecting portion of a corresponding one of the first connecting pins and the circuit board.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
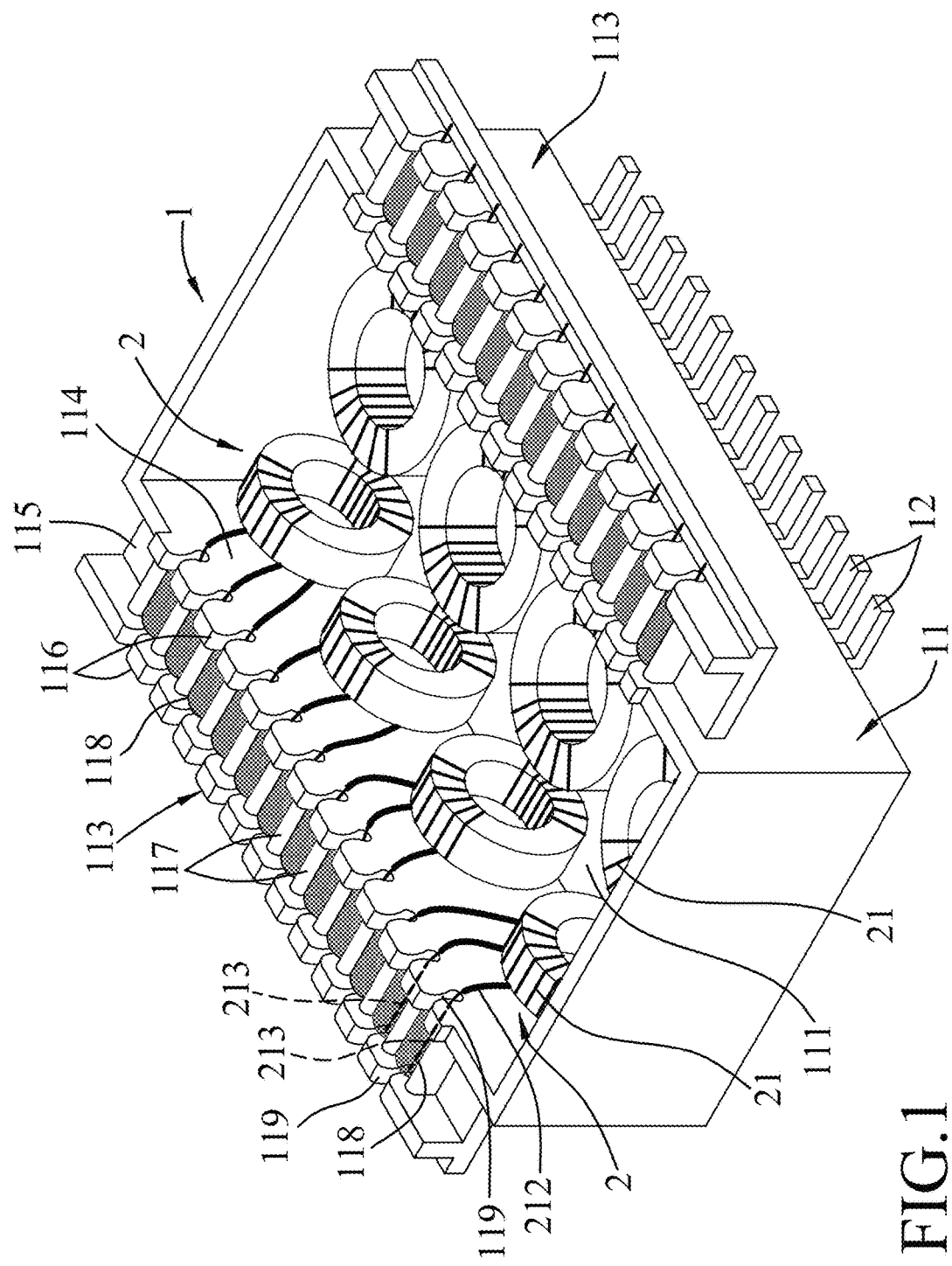
FIG. 1 is a perspective view of a conventional electronic device.
Figure 2:
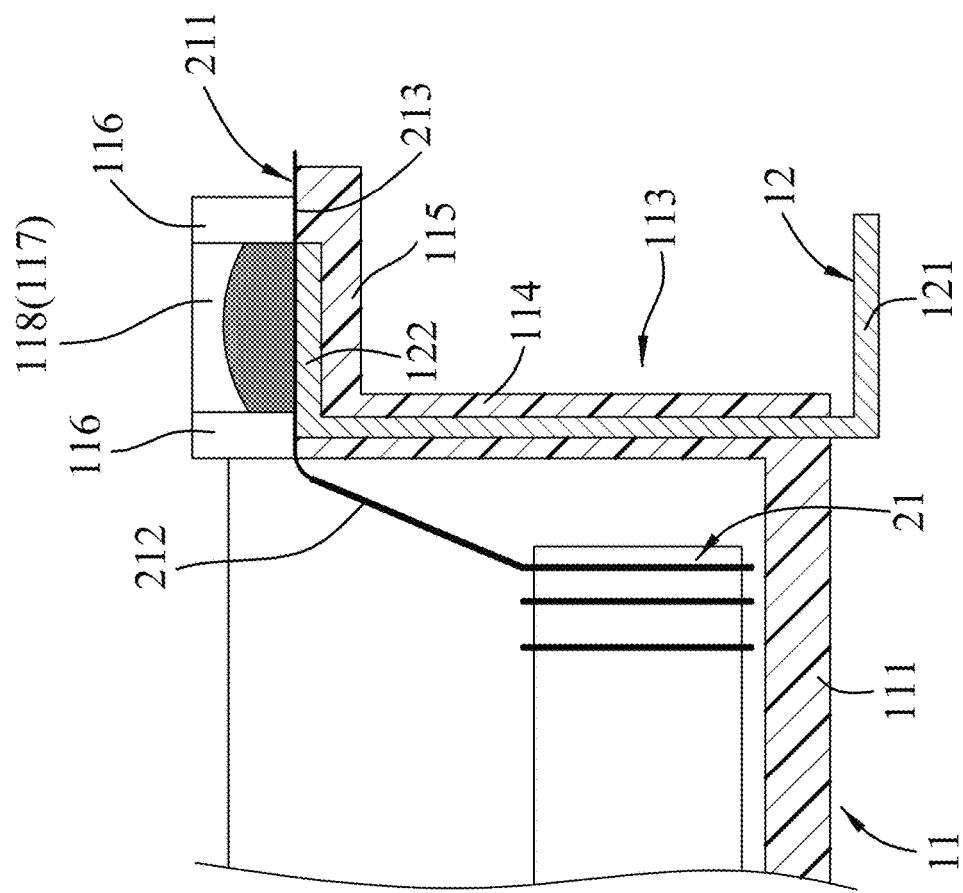
FIG. 2 is a fragmentary sectional view of the conventional electronic device.
Figure 3:
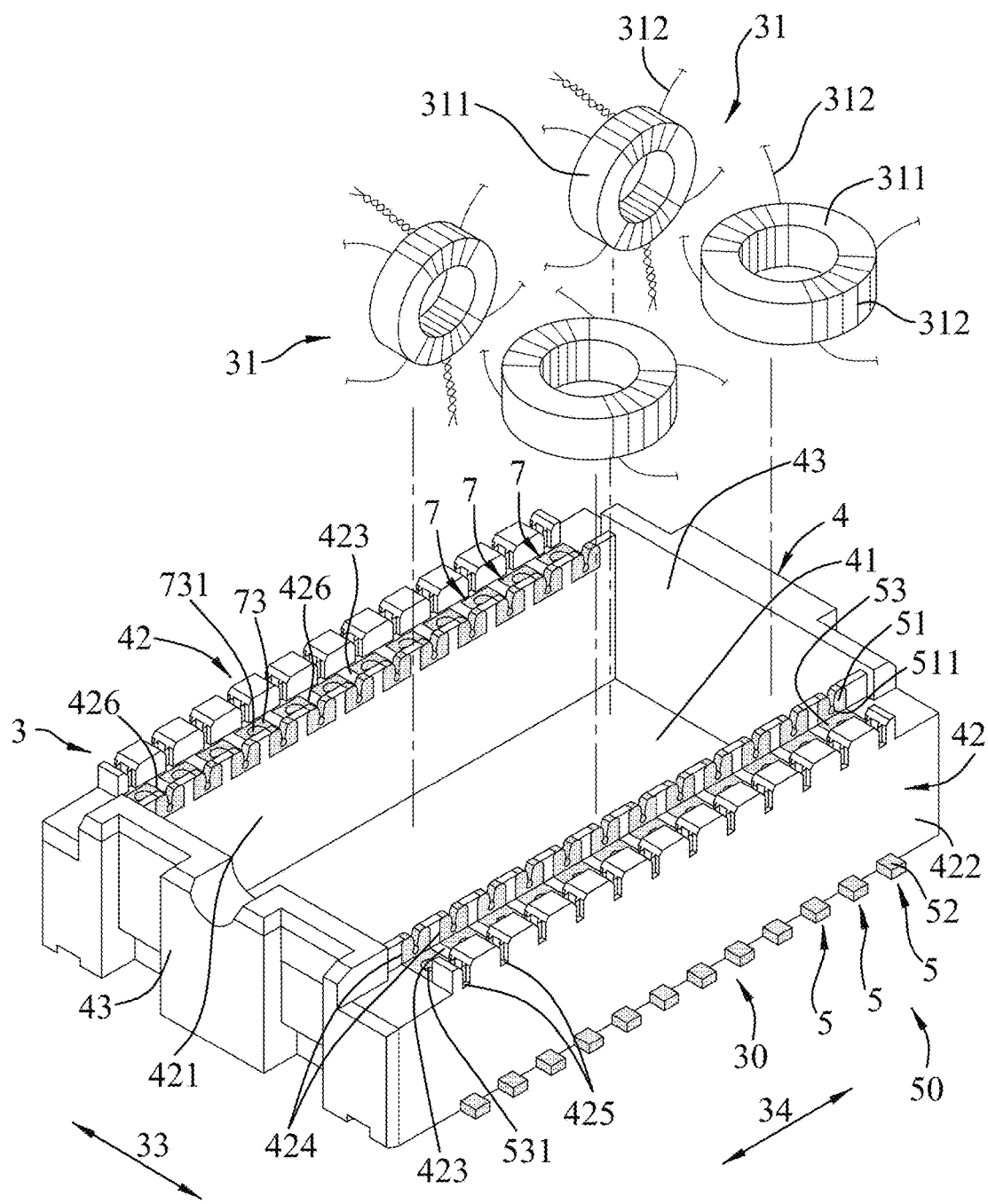
FIG. 3 is a partially exploded perspective view of an embodiment of an electronic device according to the present disclosure.
Figure 4:
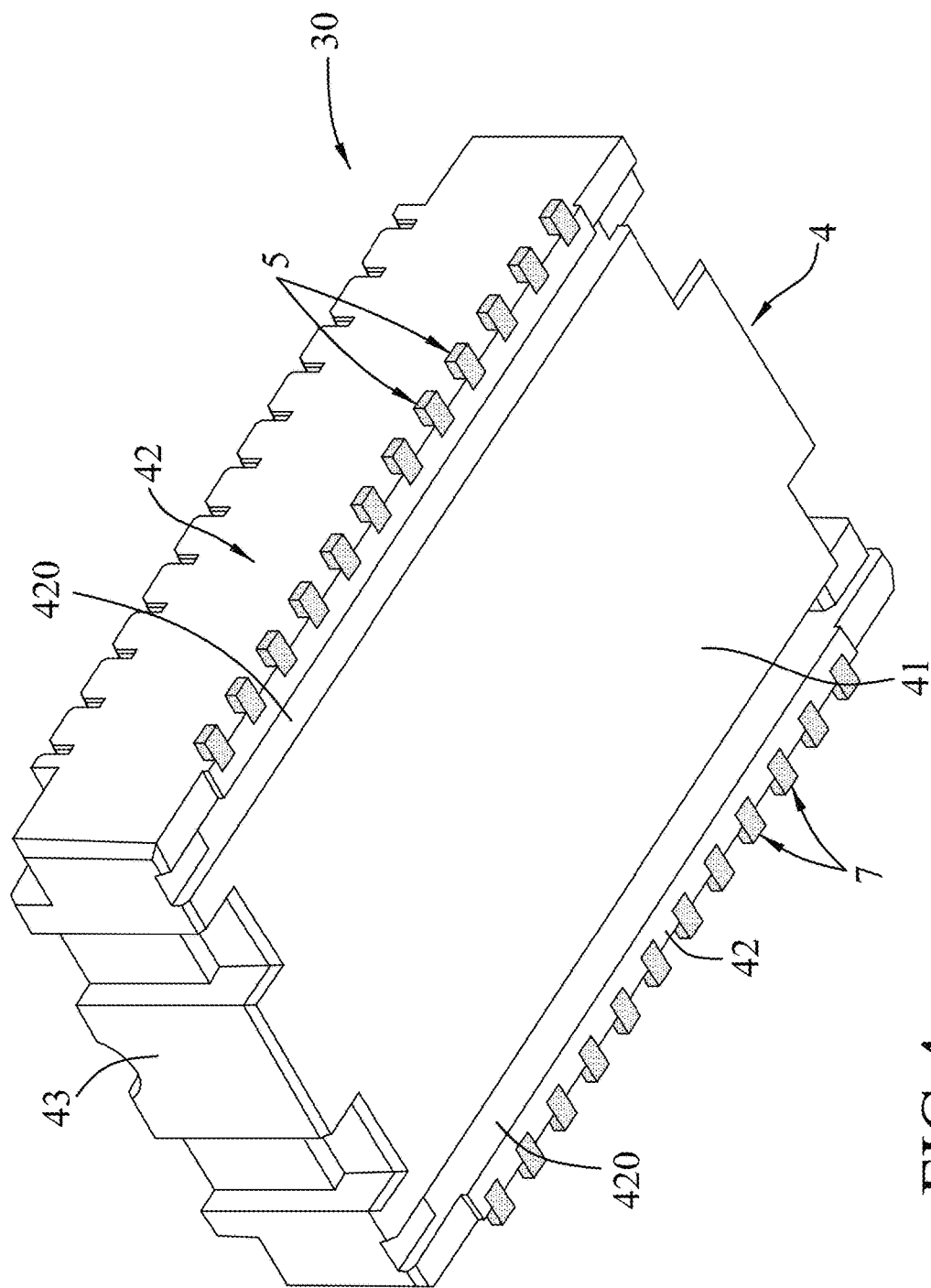
FIG. 4 is a bottom perspective view of a packaging box of the embodiment.
Figure 5:
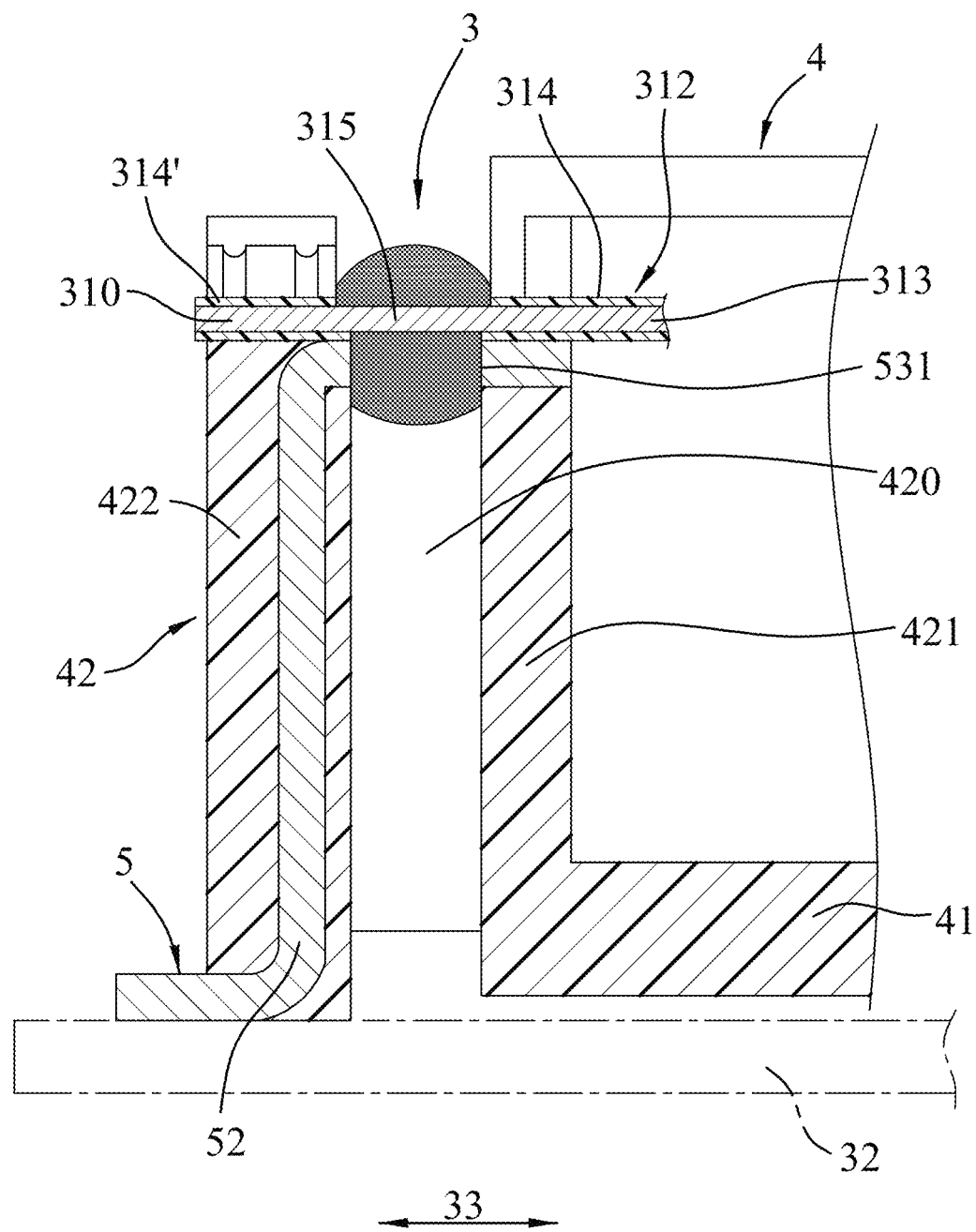
FIG. 5 is a fragmentary sectional schematic view of the embodiment.

Referring to FIGS. 3 to 5, an embodiment of an electronic device 3 according to the present disclosure is adapted to be electrically connected to a circuit board 32.

The electronic device includes a packaging box 30 and a plurality of electronic units 31. Only two of the electronic units 31 are shown in FIG. 3, and only one of the same is described hereinafter for the sake of simplicity. The number of the electronic units 31 may be one or more than two, based on actual requirements.

The packaging box 30 includes a base 4 that is made of an electrically insulating material, and a connecting pin unit 50 that includes a plurality of first connecting pins 5 and a plurality of second connecting pins 7.

The electronic unit 31 is mounted to the base 4, and includes two cores 311, and a plurality of wires 312 that are wound on a corresponding one of the cores 311. Each of the wires 312 includes a wire core 313, an intermediate insulating layer 314 that is electrically insulative and that is sleeved on an intermediate portion of the wire core 313 of a corresponding one of the wires 312, and two end insulating layers 314' that are electrically insulative and that are respectively sleeved on two opposite distal ends of the wire core 313, so that each of two opposite end portions 310 of the corresponding wire 312 has an electrically conductive portion 315 that is a portion of the corresponding wire core 313 and that is exposed between the insulating layer 314 and the corresponding end insulating layer 314' of the corresponding wire 312.

The base 4 includes a substrate 41, two wire holding platforms 42 and two connecting plates 43. The substrate 41 is adapted to be parallel to the circuit board 32. The wire holding platforms 42 are respectively connected to opposite ends of the substrate 41 and are spaced apart from each other in a first direction 33. The connecting plates 43 are spaced apart from each other in a second direction 34 and are connected to the substrate 41 and the wire holding platforms 42. Each of the wire holding platforms 42 includes an inner wall 421, an outer wall 422 and a holding wall 423. The inner wall 421 and outer wall 422 of each of the wire holding platforms 42 are spaced apart from each other in the first direction 33. The holding wall 423 of each of the wire holding platforms 42 is connected between the inner wall 421 and the outer wall 422 of a corresponding one of the wire holding platforms 42, and cooperates with the inner wall 421 and the outer wall 422 of the corresponding one of the wire holding platforms 42 to define an extending groove 420 that is adapted to open toward the circuit board 32.

Figure 6:
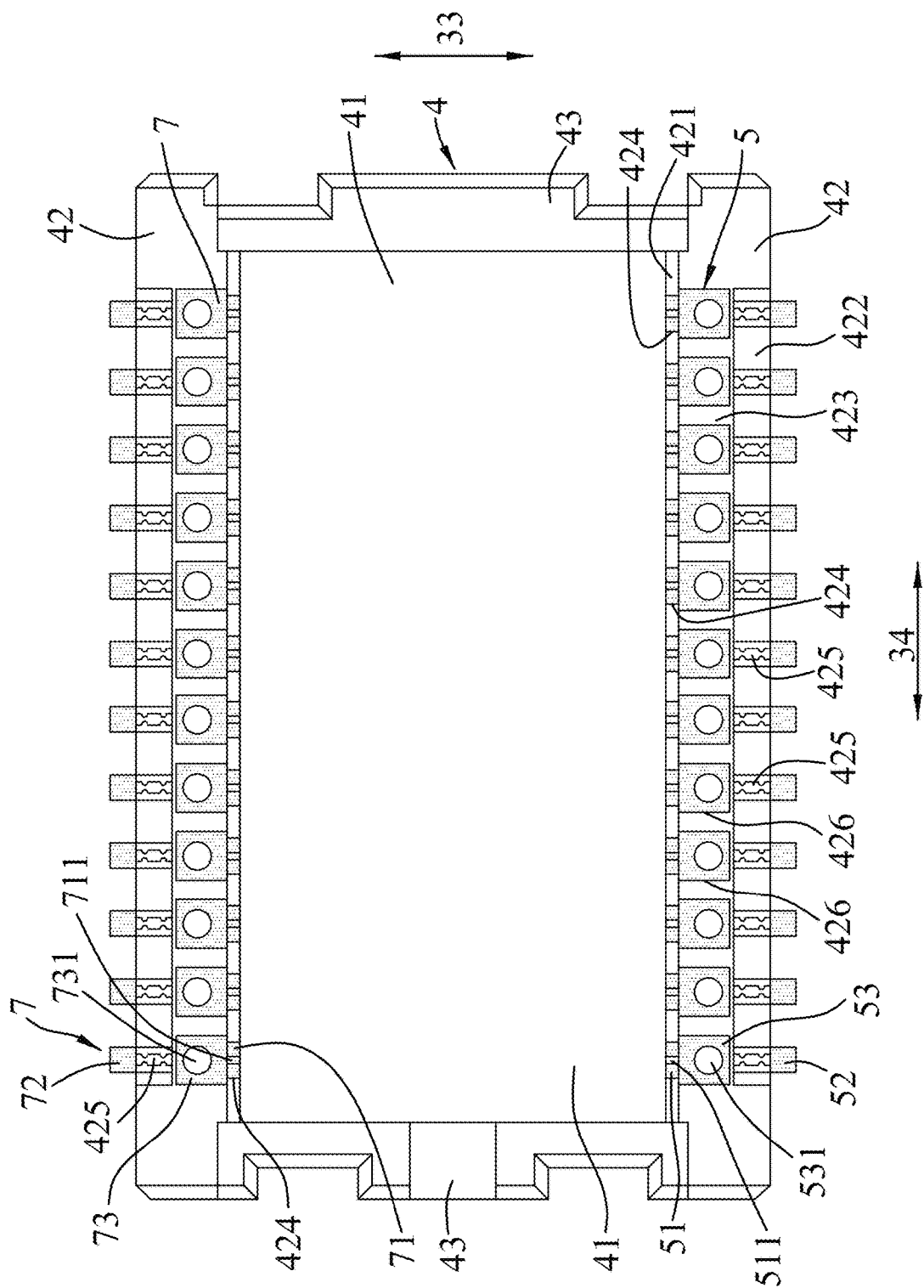
FIG. 6 is a top view of the packaging box of the embodiment.
Figure 7:
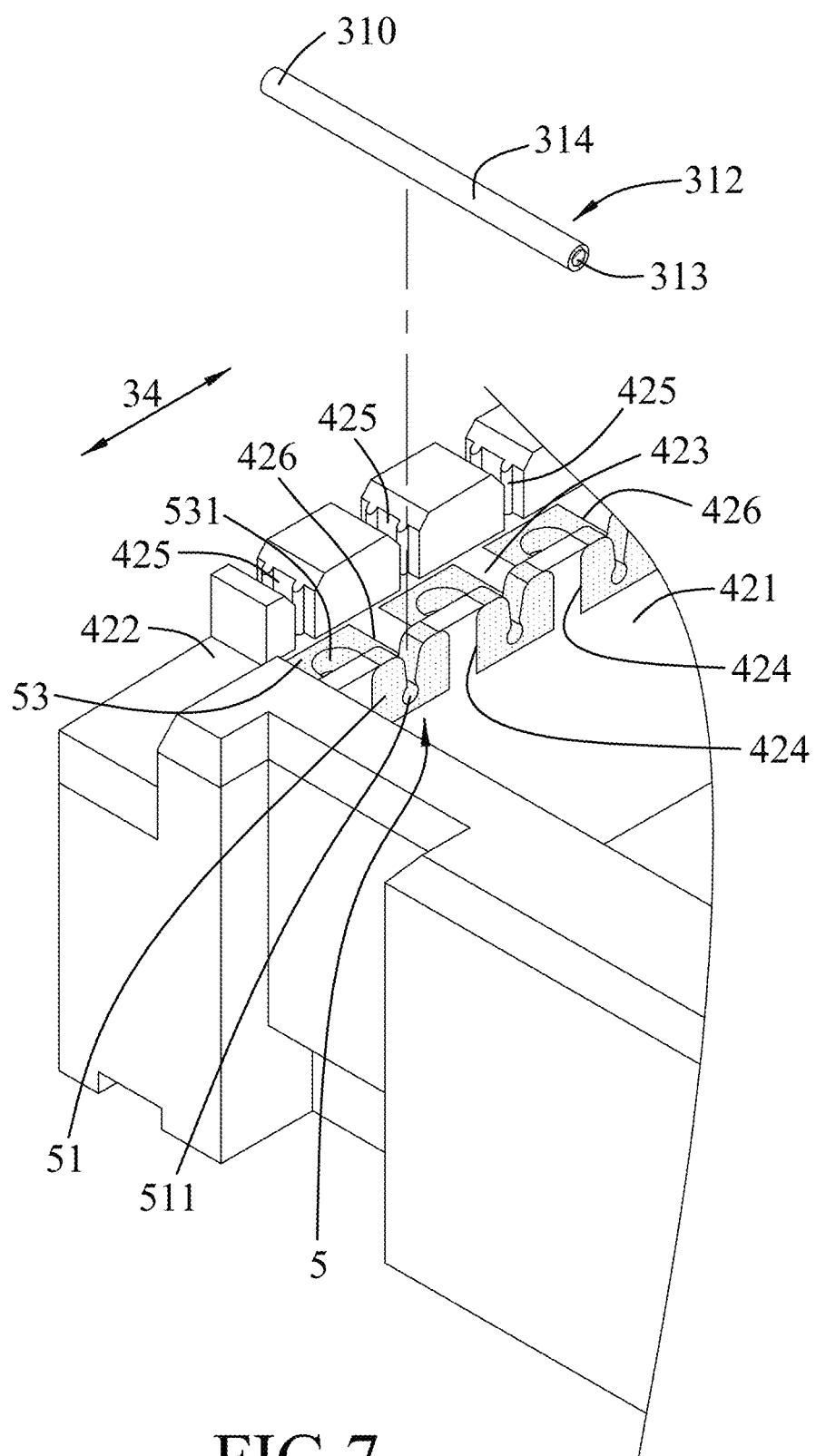
FIG. 7 is a partially exploded fragmentary perspective view of the embodiment.

Referring to FIGS. 5 to 7, for each of the wire holding platforms 42, the inner wall 421 has a plurality of receiving openings 424 that are spaced apart from each other in the second direction 34, the outer wall 422 has a plurality of outer wire holding grooves 425 that are spaced apart from each other in the second direction 34 and that are respectively aligned with the receiving openings 424 in the first direction 33, and the holding wall 423 has a plurality of insertion through holes 426 that are spaced apart from each other in the second direction 34, that are respectively aligned with the receiving openings 424 of the inner wall 421 and the outer wire holding grooves 425 of the outer wall 422 in the first direction 33, and that each specially communicate with the extending groove 420. The first connecting pins 5 of the connecting pin unit 50 are mounted to one of the wire holding platforms 42, and are spaced apart from each other in the second direction 34. The second connecting pins 7 of the connecting pin unit 50 are mounted to the other one of the wire holding platforms 42, and are spaced apart from each other in the second direction 34.

Each of the first connecting pins 5 has a first holding portion 51, a first electrically connecting portion 52 and a first wire connecting portion 53. The first wire connecting portion 53 of each of the first connecting pins 5 is mounted in a corresponding one of the insertion through holes 426 of the one of the holding platforms 42, and has a first through hole 531 that is formed therethrough and that is in spatial communication with the extending groove 420 of the one of the holding platforms 42. The first holding portion 51 of each of the first connecting pins 5 is electrically connected to the first wire connecting portion 53 of a corresponding one of the first connecting pins 5, is disposed on the inner wall 421 of the one of the wire holding platforms 42, and has a first wire holding groove 511 located in a respective one of the receiving openings 424 of the inner wall 421 of the one of the wire holding platforms 42, and detachably holding a corresponding one of the wires 312 of the electronic unit 31. The first electrically connecting portion 52 of each of the first connecting pins 5 is partially mounted in the outer wall 422 of the one of the wire holding platforms 42, and is adapted to be electrically connected between the first wire connecting portion 53 of a corresponding one of the first connecting pins 5 and the circuit board 32. In other words, the first wire holding groove 511 of the first holding portion 51 of each of the first connecting pins 5 is aligned with the first through hole 531 of the first wire connecting portion 53 of a corresponding one of the first connecting pins 5 and a respective one of the outer wire holding grooves 425 of the outer wall 422 of the one of the wire holding platforms 42.

Similarly, each of the second connecting pins 7 has a second holding portion 71, a second electrically connecting portion 72 and a second wire connecting portion 73. The second wire connecting portion 73 of each of the second connecting pins 7 is mounted in a corresponding one of the insertion through holes 426 of the other one of the holding platforms 42, and has a second through hole 731 that is formed therethrough and that is in spatial communication with the extending groove 420 of the other one of the holding platforms 42. The second holding portion 71 of each of the second connecting pins 7 is electrically connected to the second wire connecting portion 73 of a corresponding one of the second connecting pins 7, is disposed on the inner wall 421 of the other one of the wire holding platforms 42, and has a second wire holding groove 711 located in a respective one of the receiving openings 424 of the inner wall 421 of the other one of the wire holding platforms 42, and detachably holding a corresponding one of the wires 312 of the electronic unit 31. The second electrically connecting portion 72 of each of the second connecting pins 7 is partially mounted in the outer wall 422 of the other one of the wire holding platforms 42, and is adapted to be electrically connected between the second wire connecting portion 73 of a corresponding one of the second connecting pins 7 and the circuit board 32. In other words, the second wire holding groove 711 of the second holding portion 71 of each of the second connecting pins 7 is aligned with the second through hole 731 of the second wire connecting portion 73 of a corresponding one of the second connecting pins 7 and a respective one of the outer wire holding grooves 425 of the outer wall 422 of the other one of the wire holding platforms 42.

Figure 8:
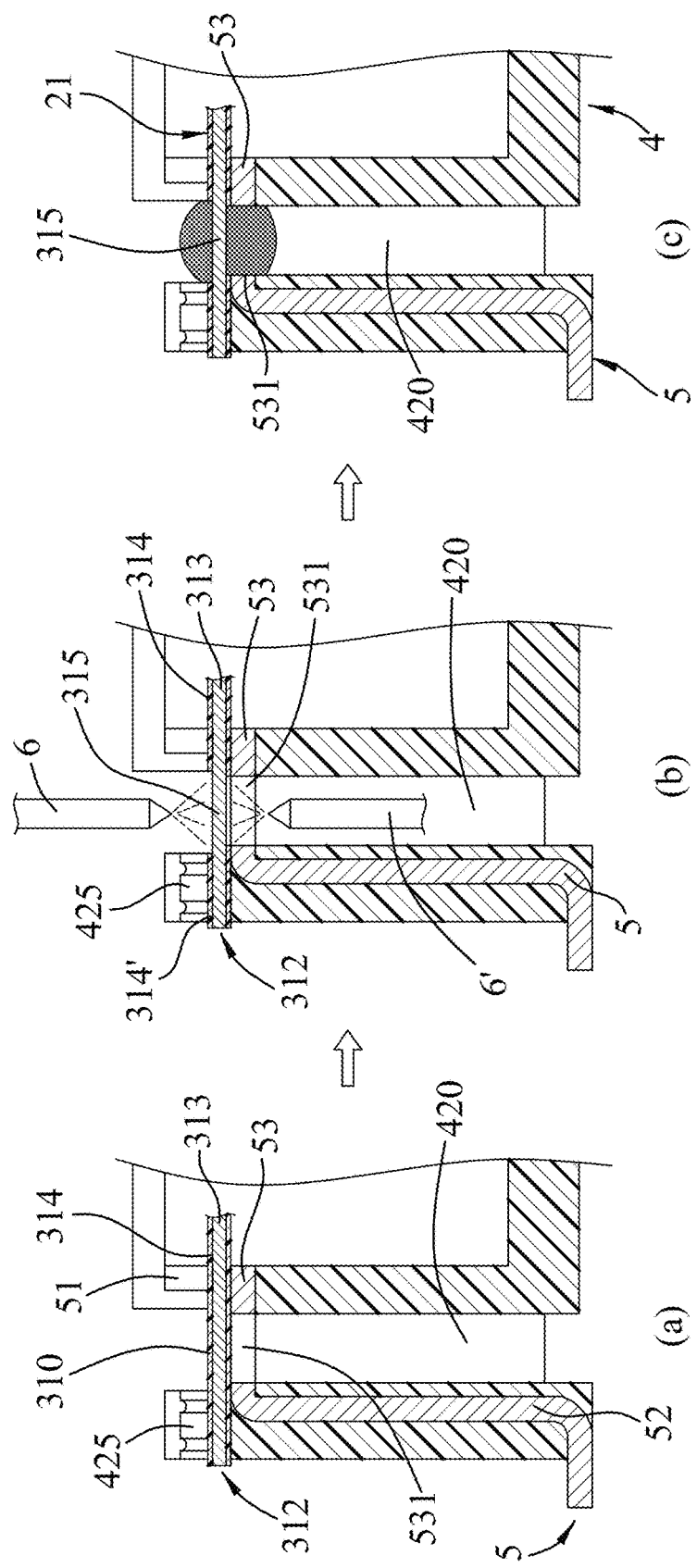
FIG. 8 is a schematic view showing a process of assembling the embodiment.

Referring to FIGS. 3, 7 and 8, during manufacturing of the electronic device 3, the first connecting pins 5 and the second connecting pins 7 are partially embedded in the base 4 to form the packaging box 30. The connection between the electronic unit 31 and the first connecting pins 5 is similar to the connection between the electronic unit 31 and the second connecting pins 7. Therefore, only a process for connecting the electronic unit 31 and the first connecting pins 5 is described hereinafter for the sake of simplicity. The coils 311 of the electronic unit 31 are placed on the substrate 41 of the base 4. Then, each of the end portions 310 of each of the wires 312 is pulled toward the one of the wire holding platforms 42, is detachably held on a corresponding one of the outer wire holding grooves 425 of the outer wall 422 of the one of the wire holding platforms 42 and the first wire holding groove 511 of the first holding portion 51 of a corresponding one of the first connecting pins 5, and spans the first through hole 531 of the first wire connecting portion 53 of the corresponding one of the first connecting pins 5 (see part (a) of FIG. 8). Afterwards, referring to part (b) of FIG. 8, a first ablation machine 6 such as a laser source is located above the holding wall 423 of the one of the wire holding platforms 42 at a position proximate to the corresponding first through hole 531, and is driven to burn off an upper portion of the insulating layer 314 of a corresponding one of the wires 312, and a second ablation machine 6' is located under the holding wall 423 of the one of the wire holding platforms 42 at a position proximate to the corresponding first through hole 531, and is driven to burn off a lower portion of the insulating layer 314 of the corresponding one of the wires 312 via the extending groove 420 of the one of the wire holding platforms 42, such that the electrically conductive portion 315 of the wire core 313 of the corresponding one of the wires 312 is exposed, thereby avoiding misalignment between the electrically conductive portion 315 of the wire core 313 of the corresponding one of the wires 312 and the first wire connecting portion 53 of the corresponding one of the first connecting pins 5. Then, referring to part (c) of FIG. 8, a solder paste is dipped onto the first wire connecting portion 53 of the corresponding one of the first connecting pins 5. A portion of the solder paste passes through the first through hole 531 of the first wire connecting portion 53 of the corresponding one of the first connecting pins 5, such that the electrically conductive portion 315 of the wire core 313 of the corresponding one of the wires 312 is firmly soldered to the first wire connecting portion 53 of the corresponding one of the first connecting pins 5. In other embodiments, a plurality of the first ablation machines 6 and the second ablation machines 6' may be provided for speeding up the manufacturing process.

It is worth mentioning that with the formation of the extending grooves 420 of the wire holding platforms 42, the second ablation machine 6' can be used for ablating the lower portion of the insulating layer 314. It is noted that, if only the first ablation machine 6 is used, the energy may be either too small to fully expose the electrically conductive portion 315 or too large to damage the electrically conductive portion 315.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An electronic device adapted to be electrically connected to a circuit board, said electronic device comprising:
    a packaging box including a base and a connecting pin unit that includes a plurality of first connecting pins, said base including at least one wire holding platform that includes a holding wall having a plurality of insertion through holes spaced apart from each other, said first connecting pins being mounted to said wire holding platform, each of said first connecting pins having a first wire connecting portion that is mounted in a corresponding one of said insertion through holes of said wire holding platform and that has a first through hole formed therethrough, and a first electrically connecting portion that is adapted to be electrically connected between said first wire connecting portion of a corresponding one of said first connecting pins and the circuit board; and
    an electronic unit mounted to said base and including a plurality of wires, each of said wires having two electrically conductive portions, each of which is electrically connected to said first wire connecting portion of a corresponding one of said first connecting pins.

2. The electronic device as claimed in claim 1, wherein said base includes two of said wire holding platforms and further includes a substrate, said wire holding platforms being connected to said substrate and being spaced apart from each other in a first direction, each of said wire holding platforms further including an inner wall and an outer wall that are spaced apart from each other in the first direction, said holding wall of each of said wire holding platforms being connected between said inner wall and said outer wall of a corresponding one of said wire holding platforms, and cooperating with said inner wall and said outer wall of the corresponding one of said wire holding platforms to define an extending groove that is adapted to open toward the circuit board, said connecting pin unit further including a plurality of second connecting pins, said first connecting pins of said connecting pin unit being mounted to one of said wire holding platforms, said second connecting pins of said connecting pin unit being mounted to the other one of said wire holding platforms, each of said second connecting pins having a second wire connecting portion that is mounted in a corresponding one of said insertion through holes of the other one of said wire holding platforms and that has a second through hole formed therethrough, and a second electrically connecting portion that is adapted to be electrically connected between said second wire connecting portion of said second connecting pin and the circuit board, each of said first and second through holes of said first and second connecting pins being in spatial communication with said extending groove of a corresponding one of said wire holding platforms.

3. The electronic device as claimed in claim 2, wherein each of said first connecting pins further has a first holding portion that is electrically connected to said first wire connecting portion of a corresponding one of said first connecting pins, that is disposed on said inner wall of said one of said wire holding platforms, and that has a first wire holding groove detachably holding a corresponding one of said wires of said electronic unit, each of said second connecting pins further has a second holding portion that is electrically connected to said second wire connecting portion of a corresponding one of said second connecting pins, that is disposed on said inner wall of the other one of said wire holding platforms, and that has a second wire holding groove detachably holding a corresponding one of said wires of said electronic unit.

4. The electronic device as claimed in claim 3, wherein said outer wall of said one of said wire holding platforms has a plurality of outer wire holding grooves that are respectively aligned with said first wire holding grooves of said first connecting pins in the first direction and that correspondingly hold said wires of said electronic unit, said outer wall of the other one of said wire holding platforms has a plurality of outer wire holding grooves that are respectively aligned with said second wire holding grooves of said second connecting pins in the first direction and that correspondingly hold said wires of said electronic unit.

5. A packaging box adapted to electrically interconnect an electronic unit and a circuit board, the electronic unit including a plurality of wires, each of which has two electrically conductive portions, said packaging box comprising:
    a base including at least one wire holding platform that includes a holding wall having a plurality of insertion through holes spaced apart from each other, said base being adapted to be mounted with the electronic unit; and
    a connecting pin unit including a plurality of first connecting pins mounted to said wire holding platform, each of said first connecting pins having a first wire connecting portion that is mounted in a corresponding one of said insertion through holes of said holding platform, that has a first through hole, and that is adapted to be electrically connected to a corresponding one of the electrically conductive portions of a corresponding one of the wires of the electronic unit, and a first electrically connecting portion that is adapted to be electrically connected between said first wire connecting portion of a corresponding one of said first connecting pins and the circuit board.

6. The packaging box as claimed in claim 5, wherein said base includes two of said wire holding platforms and further includes a substrate, said wire holding platforms being connected to said substrate and being spaced apart from each other in a first direction, each of said wire holding platforms further including an inner wall and an outer wall that are spaced apart from each other in the first direction, said holding wall of each of said wire holding platforms being connected between said inner wall and said outer wall of a corresponding one of said wire holding platforms, and cooperating with said inner wall and said outer wall of the corresponding one of said wire holding platforms to define an extending groove that is adapted to open toward the circuit board, said connecting pin unit further including a plurality of second connecting pins, said first connecting pins of said connecting pin unit being mounted to one of said wire holding platforms, said second connecting pins of said connecting pin unit being mounted to the other one of said wire holding platforms, each of said second connecting pins having a second wire connecting portion that is mounted in a corresponding one of said insertion through holes of the other one of said wire holding platforms and that has a second through hole, and a second electrically connecting portion that is adapted to be electrically connected between said second wire connecting portion of a corresponding one of said second connecting pins and the circuit board, each of said first and second through holes of said first and second connecting pins being in spatial communication with said extending groove of a corresponding one of said wire holding platforms.

7. The packaging box as claimed in claim 6, wherein each of said first connecting pins further has a first holding portion that is electrically connected to said first wire connecting portion of a corresponding one of said first connecting pins, that is disposed on said inner wall of said one of said wire holding platforms, and that has a first wire holding groove adapted to detachably hold a corresponding one of the wires of the electronic unit, each of said second connecting pins further having a second holding portion that is electrically connected to said second wire connecting portion of a corresponding one of said second connecting pins, that is disposed on said inner wall of the other one of said wire holding platforms, and that has a second wire holding groove adapted to detachably hold a corresponding one of said wires of said electronic unit.

8. The packaging box as claimed in claim 7, wherein said outer wall of said one of said wire holding platforms has a plurality of outer wire holding grooves that are respectively aligned with said first wire holding grooves of said first connecting pins in the first direction and that are adapted to correspondingly hold said wires of said electronic unit, said outer wall of the other one of said wire holding platforms having a plurality of outer wire holding grooves that are respectively aligned with said second wire holding grooves of said second connecting pins in the first direction and that are adapted to correspondingly hold said wires of said electronic unit.

\* \* \* \* \*